United States Patent [19]

Rubin et al.

[11] Patent Number: 4,592,926

[45] Date of Patent: Jun. 3, 1986

[54] PROCESSING APPARATUS AND METHOD

[75] Inventors: Richard H. Rubin, West Paterson; Gary Hillman, Livingston, both of N.J.

[73] Assignee: Machine Technology, Inc., Parsippany, N.J.

[21] Appl. No.: 612,611

[22] Filed: May 21, 1984

[51] Int. Cl.[4] .......................... B05D 5/12; C23C 16/00
[52] U.S. Cl. ........................................ 427/82; 427/93; 427/255; 427/255.6; 427/207.1; 118/733; 118/729; 118/725; 118/676; 118/500; 414/217; 430/272
[58] Field of Search ................ 118/719, 733, 729, 725, 118/500, 676, 730, 728; 414/217; 427/93.82, 255.6, 255, 207.1, 314; 430/128, 272

[56] References Cited

U.S. PATENT DOCUMENTS

| | | | |
|---|---|---|---|
| 3,549,368 | 12/1970 | Collins et al. | 430/327 |
| 3,921,572 | 11/1975 | Brunner et al. | 118/730 |
| 3,981,791 | 9/1976 | Rosvold | 118/733 |
| 4,058,430 | 11/1977 | Suntola et al. | 427/255 X |
| 4,226,208 | 10/1980 | Nishida et al. | 118/730 X |
| 4,311,427 | 1/1982 | Coad et al. | 118/729 X |
| 4,338,883 | 7/1982 | Mahler | 118/719 |
| 4,373,470 | 2/1983 | Martin | 118/729 X |
| 4,382,739 | 5/1983 | Mack et al. | 414/217 |

OTHER PUBLICATIONS

Mittall et al, "Vapor Deposited Adhesion Promoters" IBM Technical Disclosure Bulletin, vol. 17, No. 12, May 1975 p. 3718.

Primary Examiner—Bernard F. Plantz
Attorney, Agent, or Firm—Lerner, David, Littenberg, Krumholz & Mentlik

[57] ABSTRACT

A vacuum processing apparatus and method utilize a vacuum chamber formed from a pair of casing sections, one of which is movable in to and out of sealing engagement with the other casing section. The movable casing section is equipped to carry a workpiece such that the workpiece is carried by the movable casing section as it moves into and out of sealing engagement with the other casing section and such that the workpiece is delivered to a processing station associated with the other casing section when the two casing sections are in sealing engagement with each other.

27 Claims, 6 Drawing Figures

PROCESSING APPARATUS AND METHOD

FIELD OF THE INVENTION

The present invention relates to an apparatus and method for performing a processing operation on a workpiece, and, more particularly, to such an apparatus and method which are especially adapted for use in connection with the vapor deposition, in a vacuum, of a priming solution on a silicon wafer during the production of a semiconductor device therefrom.

BACKGROUND OF THE INVENTION

In the manufacture of semiconductor devices, silicon wafers are typically employed. These silicon wafers must be coated with photoresist. To enhance adhesion of the photoresist to the silicon wafer, the wafer must first be primed with HMDS (hexamethyldisilazane).

There are three known techniques for applying HMDS to the silicon wafer. In accordance with one prior art technique, HMDS in a liquid form is simply applied directly to the wafer as it is spun. Because this stream technique is typically performed in an open environment, the silicon wafer is exposed to water vapor in the atmosphere. The water vapor has a detrimental affect on the adhesion of the photoresist to the wafer.

In an effort to avoid exposing the silicon wafer to water vapor during the priming process, another technique involves heating the silicon wafer to evaporate any water which is present thereon and exposing the wafer to HMDS vapor, which condenses onto the wafer. However, the water vapor present in the chamber still has a detrimental affect on the priming process.

In an effort to expose the silicon wafer to as little water vapor as possible, yet another technique involves placing batches of wafers in a heated vacuum chamber. One problem with such a batch priming technique is that it does not lend itself to production line automation, whereby the wafer is subjected to successive processing operations without operator interface.

SUMMARY OF THE INVENTION

The problems and disadvantages of the prior systems described above are overcome in accordance with the present invention by providing a processing apparatus comprising a first casing section and a second casing section which is movable into and out of sealing engagement with the first casing section. When the second casing section is in sealing engagement with the first casing section, the casing sections cooperate with each other to form a sealed interior chamber. The second casing section is adapted to support a workpiece such that the workpiece is carried by the second casing section as the second casing section moves into and out of sealing engagement with the first casing section and such that the workpiece is delivered to a processing station associated with the first casing section when the first and second casing sections are in sealing engagement with each other.

Because the second casing section actually carries the workpiece, there is no need for a separate workpiece carrier, such as a plunger, to handle the workpiece after it has been delivered to the processing apparatus. If, for instance, such a plunger were employed to handle a workpiece, two seals would be required: one between the first and second casing sections and another between the plunger and at least one of the casing sections. Thus, the present invention minimizes the number of seals required to seal the interior chamber, thereby providing a less complicated apparatus and one whose seal is easier to maintain. In order to further maintain the integrity of the seal between the first and second casing sections even if they are not arranged perfectly parallel to each other, the second casing section can be supported such that it gimbals as it is moved into sealing engagement with the first casing section.

The processing apparatus can be constructed as a module adapted for removable attachment to a machine which makes semiconductor devices from silicon wafers. In such an application, the processing apparatus is especially suited to perform an HMDS priming process in a vacuum. So as to evaporate water from the silicon wafer during such a priming process, the processing station is provided with a heater adapted to heat the silicon wafer to a temperature sufficiently high to achieve the desired evaporation of water from the silicon wafer. While the silicon wafer is being heated, HMDS vapor is supplied under vacuum to the interior chamber, in which a vacuum has already been created. The HMDS vapor condenses onto the silicon wafer to prime it for application of photoresist. Because of its modular construction, the processing apparatus can be directly interfaced with a photoresist module, so that the silicon wafer may be processed in accordance with a completely automated production line approach.

In order to perform an HMDS priming process using the above-described apparatus, the second casing section is spaced a first distance from the first casing section. After supporting a silicon wafer from the second casing section, the second casing section is moved until it is spaced a second distance from the first casing section, the second distance being greater than the first distance, whereby such movement of the second casing section effects the transfer of the silicon wafer from a delivery device, such as an extendable arm, to the second casing section. As the second casing section is moved from its second position into sealing engagement with the first casing section, the silicon wafer is delivered to the processing station. The interior chamber formed when the first and second casing sections are in sealing engagement with each other is then evacuated to form a vacuum therein. While the vacuum in the interior chamber is being maintained and the silicon wafer is being heated, HMDS vapor under vacuum is supplied to the interior chamber. At the conclusion of a purging operation designed to remove all HMDS vapor from the interior chamber, the silicon wafer is removed from the processing station by moving the second casing section to its first position.

BRIEF DESCRIPTION OF THE DRAWINGS

For a more complete understanding of the present invention, reference is made to the following detailed description of the invention considered in conjunction with the accompanying drawings, in which.

DETAILED DESCRIPTION OF THE EXEMPLARY EMBODIMENT

Although the present invention is suitable for use in connection with many different types of processing operations, it is especially suited for use in connection with the vapor deposition, in a vacuum, of a priming solution on a silicon wafer during the production of a semiconductor device therefrom. Accordingly, the present invention will be described in connection with such a vacuum priming operation.

Figure 1:
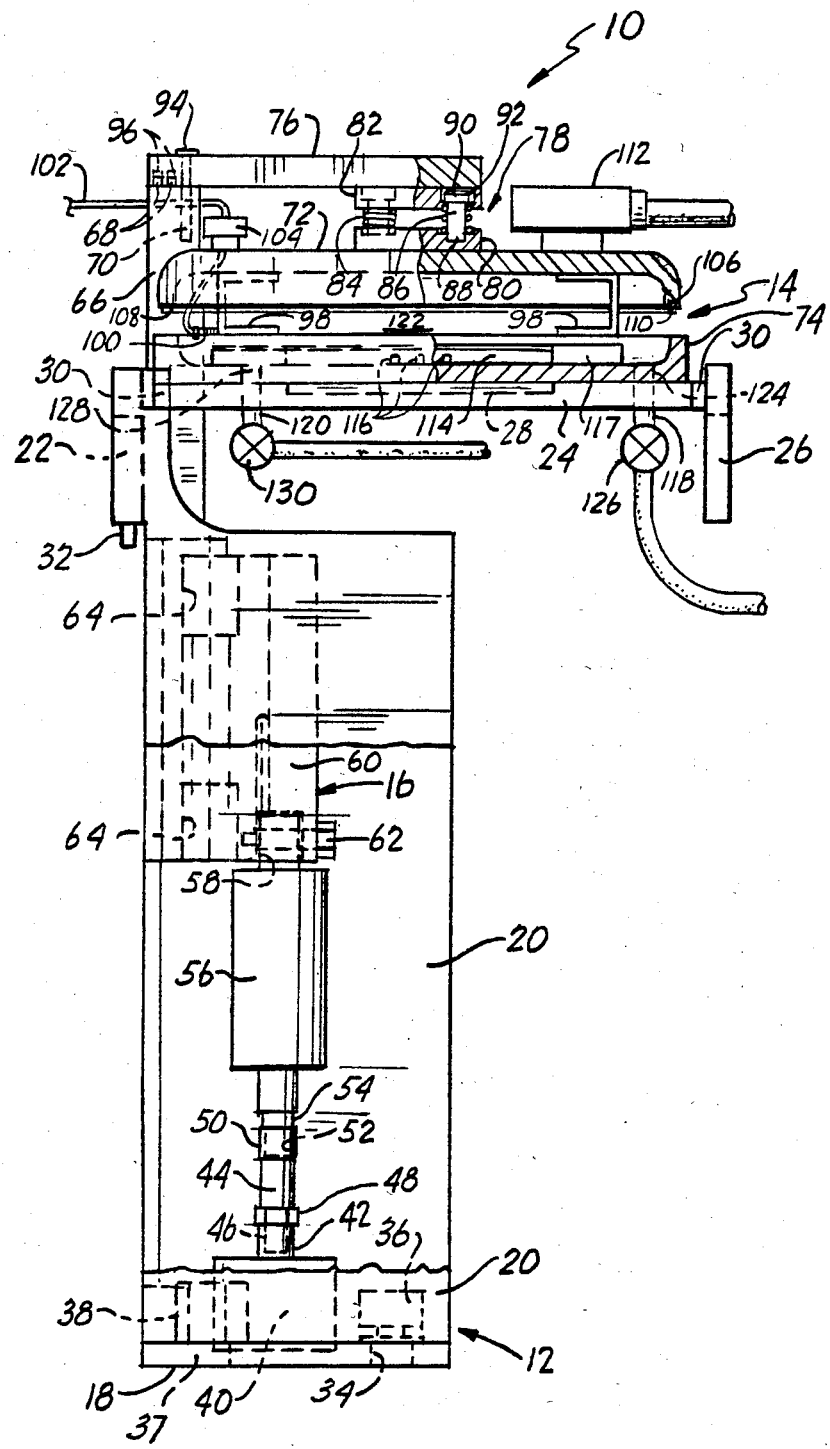
FIG. 1 is a side elevational view of an exemplary embodiment of a vapor processing module constructed in accordance with the present invention, portions of the module being broken away to facilitate consideration and discussion.
Figure 2:
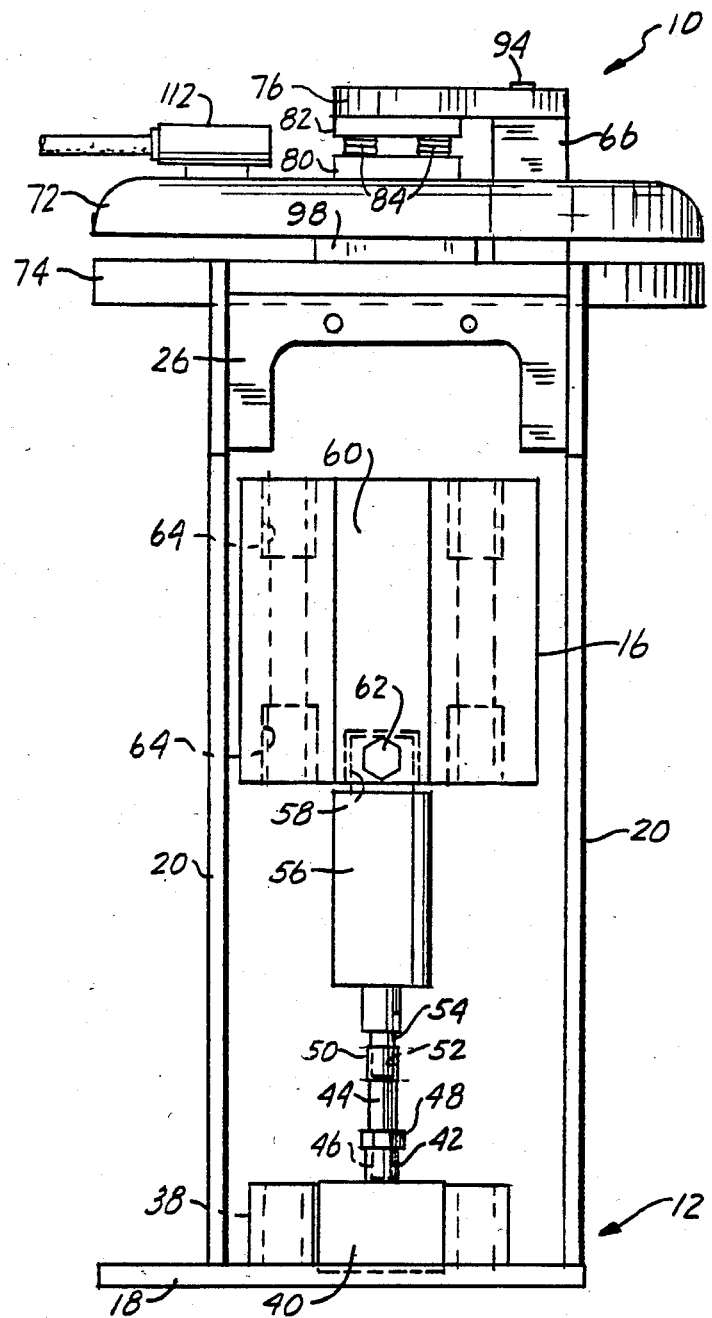
FIG. 2 is a front elevational view of the vapor processing module illustrated in FIG. 1.
Figure 3:
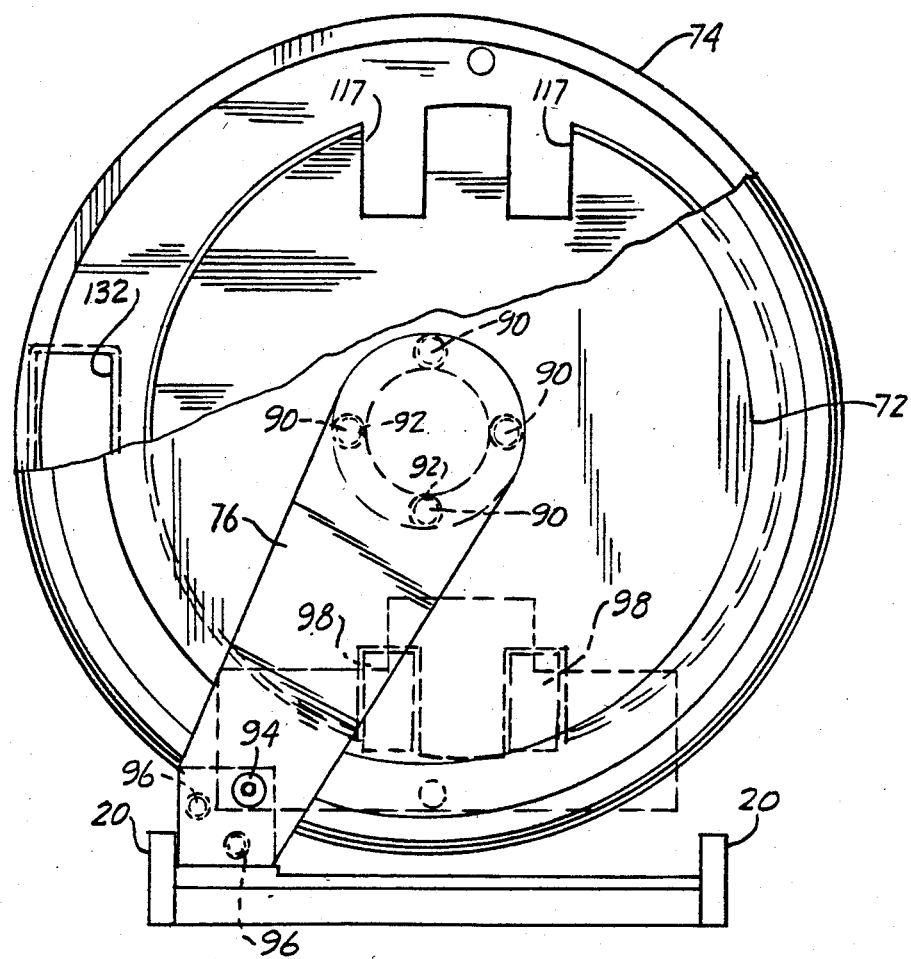
FIG. 3 is a top view of the vapor processing module illustrated in FIGS. 1 and 2, a portion of the module being broken away to facilitate consideration and discussion.

Referring to FIGS. 1-3, there is shown a vacuum processing module 10 which includes a frame 12, a vacuum chamber 14 and a slide assembly 16. What follows is a more detailed description of the frame 12, the vacuum chamber 14 and the slide assembly 16.

The frame 12 includes a base plate 18 and a pair of identical side plates 20 attached to and extending upwardly from opposite sides of the base plate 18. A gusset 22 extends between the upper ends of the two side plates 20. A support plate 24 is attached to the gusset 22 at one end thereof. The opposite end of the support plate 24 is attached to another gusset 26. The support plate 24 holds an electrical heating coil 28, which is controlled by a heat sensor (not shown) through an appropriate feedback circuit (not shown). Thermal insulators 30 are positioned between the support plate 24 and the gussets, 22, 26 in order to inhibit the heat generated by the heating coil 28 from being transferred throughout the rest of the frame 12.

The gusset 22 has locating pins 32 sized and shaped so as to be received in holes provided in an upper stringer of a wafer processing machine (not shown), such as the one marketed by the assignee of the present application under the mark MultiFab. The gusset 26 is designed to be supported on an opposite stringer of the MultiFab machine. Thus, the gussets 22, 26 cooperate to permit the vacuum processing module to be easily installed in and removed from the MultiFab machine. The support plate holds an electrical heating coil which is controlled by a heat sensor through a feed back circuit.

The base plate 18 includes a grommet 34 adapted to receive a quarter turn fastener 36. The quarter turn fastener 36 is sized and shaped so as to lock with a receptacle provided in an I beam of the MultiFab machine. Cutouts 37 in the base plate 18 and bearings 38 attached to the base plate 18 permit the vacuum processing module 10 to be slid in place along a twin rail of the MultiFab machine. A pneumatic pancake cylinder 40 is also mounted on the base plate 18. The pancake cylinder 40 includes a piston rod 42.

A height adjustment mechanism 44 has an externally threaded end 46 which is screwed into the piston rod 42 of the pancake cylinder 40. A jam nut 48 is threadedly received on the externally threaded end 46 of the height adjustment mechanism 44 in order to lock the height adjustment mechanism 44 in place. The height adjustment mechanism 44 also includes an internally threaded end 50 adapted to threadedly receive an externally threaded end 52 of a piston rod 54 of another pneumatic cylinder 56. The pneumatic cylinder 56 includes a tab 58.

The slide assembly 16 includes a slide block 60 which is connected by a shoulder bolt 62 to the tab 58 of the pneumatic cylinder 56. The slide block 60 includes bearings 64 which are adapted to slide along the twin rails of the MultiFab machine. A vertical hood support 66 is fixedly attached to the slide block 60. The upper end of the vertical hood support 66 is provided with a pair of locating pins 68 and an internally threaded hole 70. The function of the locating pins 68 and the threaded hole 70 will be described hereinafter.

The vacuum chamber 14 includes a chamber hood 72 and a chamber base 74. The chamber hood 72 is resiliently suspended from a horizontal hood bracket 76 by a spring capsule 78. The spring capsule 78 includes a lower plate 80 attached to the chamber hood 72, an upper plate 82 attached to the horizontal hood bracket 76 and four coil springs 84 interposed between the lower and upper plates 80, 82, respectively. Through each coil spring 84 there extends a shoulder bolt 86, having a lower end 88 which is threadedly attached to the lower plate 80, and a head 90, which is slidably received in a bore 92 provided in the upper plate 82.

The horizontal hood bracket 76 includes a captured screw 94 and two counter bored holes 96. The captured screw 94 is adapted to threadedly mate with the internally threaded hole 70 in the upper end of the vertical hood support 66. The counter bored holes 96 receive the locating pins 68 provided on the upper end of the vertical hood support 66.

A pair of wafer support fingers 98 extends downwardly from the chamber hood 72. The position of the fingers 98 can be varied in a horizontal direction so that the distance between the fingers 98 can be adjusted for the purpose of accomodating different sized wafers. On of the fingers 98 has a barbed fitting 100 which receives a tube 102. The tube 102 extends through a feedthrough fitting 104 provided on the top of the chamber hood 72 to a vacuum supply (not shown), the supply of the vacuum to the tube 102 being controlled by a suitable valve (not shown). An annular groove 106 formed in a lower rim 108 of the chamber hood 72 receives a square O-ring 110. A vacuum sensor 112 is provided on the top of the chamber hood 72. The vacuum sensor 112 is connected to a vacuum gauge (not shown) for a purpose to be described hereinafter.

The chamber base 74 is mounted on the support plate 24 in intimate contact with the electrical heating coil 28. A heat sensor (not shown) is embedded in the chamber base 74, while a wafer plate 114 rests inside the chamber base 74. Locating pins 116 extending upwardly from the bottom of the chamber base 74 properly position the wafer plate 114 inside the chamber base 74 and permit the quick and easy installation and removal of the wafer plate 114, which includes cutouts 117 sized and shaped so as to provide clearance for the wafer supporting fingers 98 on the chamber hood 72.

Two nipples 118, 120 extend downwardly from the bottom of the chamber base 74. The nipple 118, which communicates with an interior chamber 112 formed between the chamber hood 72 and the chamber base 74 through an opening 124 in the chamber base 74, is connected to a source of nitrogen (not shown) through a suitable valve 126. The nipple 120, which communicates with the interior chamber 122 through an opening 128 in the chamber base 74, is connected to a source of HMDS (not shown) under vacuum through a suitable valve 130. The bottom of the chamber base 74 is provided with a port 132 which is connected to a vacuum source (not shown).

Figure 4:
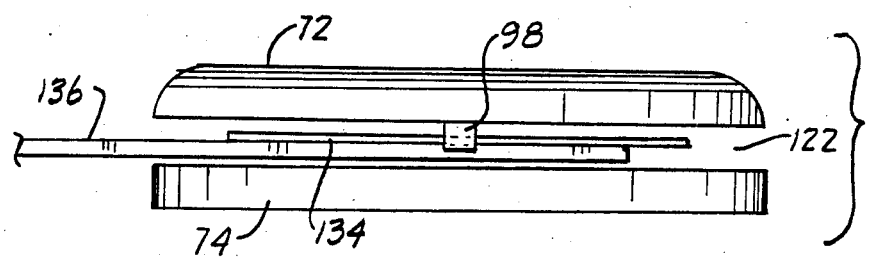
FIGS. 4-6 are schematic illustrations showing the vapor processing module of FIGS. 1-3 in three different operating positions.

The operation of the vacuum processing module 10 will now be described with reference to FIGS. 4-6, as well as to FIGS. 1-3. In operation, the chamber hood 72 is normally maintained in the position illustrated in FIGS. 1, 2 and 4. In such a position, the wafer support fingers 98 are positioned so as to receive a wafer 134 from an extendable load arm 136 which is provided with a vacuum for retaining the wafer 134 on the load arm 136. When the load arm extends into the interior chamber 122 and positions the wafer 134 above the wafer support fingers 98, a sensor (not shown) generates a signal which causes the chamber hood 72 to rise as a result of the actuation of the pneumatic cylinder 56, while the vacuum on the load arm 136 is terminated to permit the transfer of the wafer 134 from the load arm 136 to the fingers 98.

Figure 5:
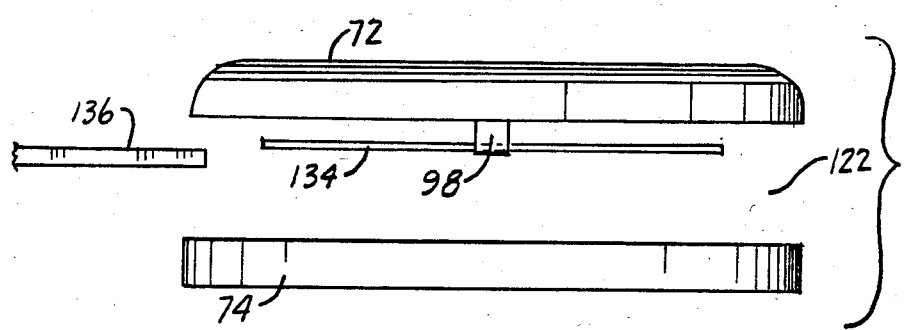
Figure 6:
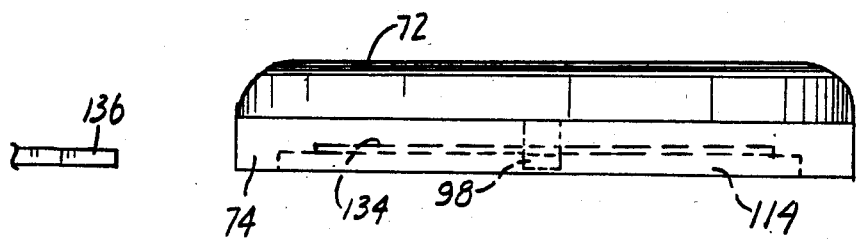

As the chamber hood 72 continues to rise to the position illustrated in FIG. 5, the wafer 134 is supported solely by the support fingers 98 on the chamber hood 72. With the wafer 134 on the support fingers 98, a vacuum is created in the tube 102. This vacuum is sensed from an appropriate sensing device (not shown), which then generates a signal which causes the automatic retraction of the load arm 136. As soon as the vacuum in the tube 102 is sensed, the vacuum supply to the tube 102 is terminated. Upon the retraction of the load arm 136, the chamber hood 72 is lowered by the pneumatic cylinder 56 to the position illustrated in FIG. 4.

If all systems are ready to perform a priming operation, the chamber hood 72 is further lowered by the pancake cylinder 40 so that the chamber hood 72 sits on the chamber base 74 (see FIG. 6), the O-ring 110 creating a vacuum-tight seal between the chamber hood 72 and the chamber base 74. During such further lowering of the chamber hood 72, the wafer 134 carried by the support fingers 98 is deposited on the wafer plate 114. The chamber hood 72 is not lowered into sealing engagement with the chamber base 74 unless the wafer plate 114 is at a predetermined temperature.

With the wafer 134 positioned on the hot wafer plate 114, any moisture on the wafer 134 is vaporized. As soon as the chamber hood 72 is sealed on the chamber base 74, the vacuum supply to the interior chamber 122 is turned on to create a vacuum in the magnitude of $1 \times 10^{-3}$ torr. When the appropriate vacuum level is achieved within the interior chamber 122, a signal is transmitted to the vacuum gauge (not shown) which, in turn, generates a signal to open the valve 130, whereby HMDS vapor is supplied to the interior chamber 122. After an appropriate length of time, such as a few seconds, the valve 130 is closed and the interior chamber 122 is brought back down to a vacuum level of approximately ten torr. This further vacuum step removes residual reaction products from the interior chamber 122.

In order to purge the interior chamber 122, the valve 126 is opened permitting nitrogen to be transferred to the interior chamber 122. After a suitable length of time, such as a few seconds, the interior chamber 122 is brought back down to a vacuum level of approximately ten torr. This nitrogen purge step is then repeated to bring the interior chamber 122 back to atmospheric pressure.

After the second nitrogen purge, the chamber hood 72 is raised to the position illustrated in FIG. 5 so that the fingers 98 on the chamber hood 72 pick up the wafer 134 from the wafer plate 114. With the chamber hood 72 in the position illustrated in FIG. 5, the wafer 134 is supported above the elevation of the load arm 136. When the chamber hood 72 reaches the position illustrated in FIG. 5, a sensor (not shown) generates a signal which causes the load arm 136 to be extended into the open interior chamber 122 beneath the wafer 134. When the load arm 136 is properly positioned below the wafer 134, a sensor (not shown) generates a signal which causes the chamber hood 72 to be lowered to the position illustrated in FIG. 4, thereby depositing the wafer 134 on the load arm 136, where it is maintained by the vacuum associated therewith. Once the wafer 134 creates such a vacuum on the load arm 136, a signal is generated which causes the retraction of the load arm 136. The vapor priming operation described above can then be repeated on another wafer.

If it is desired to process a different size wafer, the horizontal hood bracket 76 is removed from the vertical hood support 66 by releasing the captured screw 94 from the hole 70 in the upper end of the vertical hood support 66. The wafer support fingers 98 on the chamber hood 72 are then adjusted to accommodate the appropriate size wafer. The wafer plate 114 is also removed and replaced with a new wafer plate of the appropriate size. The horizontal hood bracket 76 is then reattached to the vertical hood support 66, the locating pins 68 on the upper end of the vertical hood support 66 cooperating with the holes 96 in the horizontal hood bracket 76 to properly locate the chamber hood 72 and the captured screw 94 carried by the horizontal hood bracket 76 mating with the hole 70 in the upper end of the vertical hood support 66 to lock the horizontal hood bracket 76 and, hence, the chamber hood 72 in place.

It will be understood that the embodiment described herein is merely exemplary and that a person skilled in the art may make many variations and modifications without departing from the spirit and scope of the invention. All such modifications and variations are intended to be included within the scope of the invention as defined in the appended claims.

We claim:

1. A processing apparatus, comprising a first casing section, including a processing station; a second casing section; moving means for moving said second casing section toward and away from said first casing section between a first position in which said second casing section is out of sealing engagement with said first casing section and a second position in which said second casing section is in sealing engagement with said first casing section and in which said first and second casing sections cooperate with each other to form a sealed interior chamber; and supporting means fixedly attached to said second casing section for supporting a workpiece from said second casing section such that the workpiece is carried by said second casing section as said second casing section moves between said first and second positions and such that the workpiece is disengaged from said supporting means and transferred from said second casing section to said processing station of said first casing section concurrently with the movement of said second casing section from said first position to said second position, whereby the transfer of the workpiece from said second casing section to said first casing section is made solely through the cooperation of said first casing section, including said processing station, and said second casing section, including said supporting means.

2. A processing apparatus according to claim 1, wherein said moving means includes a support member movable toward and away from said first casing section and mounting means for resiliently mounting said second casing section from said support member such that said second casing section may gimbal as said second casing section is moved from said first position to said second position.

3. A processing apparatus according to claim 1, wherein said processing station includes heating means for heating the workpiece.

4. A processing apparatus according to claim 3, further comprising first supplying means for supplying a processing vapor under vacuum to said interior chamber and second supplying means for supplying a purging gas to said interior chamber.

5. A processing apparatus according to claim 4, wherein said processing vapor is hexamethyldisilazane vapor.

6. A processing apparatus according to claim 5, wherein said purging gas is nitrogen.

7. A processing apparatus according to claim 1, wherein said supporting means includes sensing means for sensing the presence of the workpiece.

8. A processing apparatus according to claim 1, further comprising exhausting means for exhausting substantially all gas from said interior chamber when said second casing section is in said second position, whereby a vacuum is created in said interior chamber.

9. A processing apparatus according to claim 8, wherein said vacuum is approximately $1 \times 10^{-3}$ torr.

10. A processing apparatus according to claim 1, wherein said moving means moves said second casing section between said first and second positions and a third position in which said second casing section is out of sealing engagement with said first casing section.

11. A processing apparatus according to claim 1, wherein said second casing section includes sealing means for sealing said interior chamber when said second casing section is in said second position.

12. A processing apparatus according to claim 11, wherein said first casing section is a base and said second casing section is a hood.

13. A processing apparatus according to claim 1, wherein said vacuum processing apparatus is a module which includes attaching means for removably attaching said module to a machine adapted to make semiconductor devices from silicon wafers.

14. A method of processing a workpiece in a processing apparatus which includes a first casing section, a processing station associated with said first casing section, a second casing section, moving means for moving said second casing section toward and away from said first casing section between a first position in which said second casing section is out of sealing engagement with said first casing section, a second position in which said second casing section is out of sealing engagement with said first casing section, said second casing section being farther from said first casing section when it is in said second position as compared to said first position, and a third position in which said second casing section is in sealing engagement with said first casing section and in which said first and second casing sections cooperate with each other to form a sealed interior chamber, and supporting means fixedly attached to said second casing section for supporting a workpiece from said second casing section, said method comprising the steps of arranging said second casing section in said first position, positioning a workpiece a distance from said supporting means, moving said second casing section from said first position to said second position so that the workpiece is supported by said supporting means, disengaging the workpiece from said supporting means and transferring the work piece from said second casing section to said processing station of said first casing section concurrently with the movement of said second casing section from said second position to said third position, whereby the transfer of the workpiece from said second casing section to said first casing section is made solely through the cooperation of said first casing section, including said processing station, and said second casing section, including said supporting means, performing a processing operation on the workpiece while the workpiece is maintained at said processing station, and removing the workpiece from said processing station by moving said second casing section from said third position to said second position such that the workpiece is reengaged by said supporting means and transferred from said first casing section back to said second casing section.

15. A method according to claim 1, further comprising the steps of heating the workpiece while maintaining the vacuum in said interior chamber and performing said processing operation on the workpiece while the workpiece is being heated.

16. A method according to claim 14, further comprising the step of supplying a processing vapor under vacuum to said interior chamber while maintaining a vacuum in said interior chamber.

17. A method according to claim 16, wherein said processing vapor is hexamethyldisilazane vapor.

18. A method according to claim 17, further comprising the step of purging said interior chamber after said processing operation hs been carried out.

19. A method according to claim 18, wherein said interior chamber is purged with nitrogen.

20. A method according to claim 19, wherein the workpiece is delivered to said supporting means by an extendable arm, the workpiece being maintained on the arm by suction.

21. A method according to claim 20, further comprising the steps of sensing the presence of the workpiece on said supporting means, terminating the suction on the workpiece to thereby release the workpiece from the extendable arm, and retracting the extendable arm after the suction on the workpiece has been terminated.

22. A method according to claim 15, wherein the vacuum in said interior chamber is approximately $1 \times 10^{-3}$ torr.

23. A method according to claim 14, wherein the workpiece is a silicon wafer which is being processed into a semiconductor device.

24. A processing module, comprising a first casing section, including a processing station; a second casing section; moving means for moving said second casing section toward and away from said first casing section between a first position in which said second casing section is out of sealing engagement with said first casing section and a second position in which said second casing section is in sealing engagement with said first casing section and in which said first and second casing sections cooperate with each other to form a sealed interior chamber, said moving means including a support member movable toward and away from said first casing section and mounting means for resiliently mounting said second casing section from said support member such that said second casing section may gimbal as said second casing section is moved from said first position to said second position; supporting means fixedly attached to said second casing section for supporting a silicon wafer from said second casing section such that the silicon wafer is carried by said second casing section as said second casing section moves between said first and second positions and such that the silicon wafer is disengaged from said support means and transferred from said second casing section to said processing station of said first casing section concurrently with the movement of said second casing section from said first position to said second position, whereby the transfer of the workpiece from said second casing section to said first casing section is made solely through the cooperation of said first casing section, including said processing station, and said second casing section, including said supporting means; heating means included in said processing station for heating the silicon wafer; and attaching means for removably attaching said module to a semiconductor manufacturing machine.

25. A processing apparatus according to claim 10, wherein said second casing section is spaced a first distance from said first casing section when said second casing section is in said first position and wherein said second casing section is spaced a second distance from said first casing section when said second casing section is in said third position, said second distance being greater than said first distance.

26. A processing apparatus according to claim 1, wherein said moving means moves said second casing section from said second position to said first position such that the workpiece is reengaged by said supporting means and transferred from said processing station of said first casing section back to said second casing section.

27. A processing module according to claim 24, wherein said moving means moves said second casing section from said second position to said first position such that the workpiece is reengaged by said supporting means and transferred from sid processing station of said first casing section back to said second casing section.

* * * * *

UNITED STATES PATENT AND TRADEMARK OFFICE
CERTIFICATE OF CORRECTION

PATENT NO. : 4,592,926

DATED : June 3, 1986

INVENTOR(S) : Rubin et al.

It is certified that error appears in the above-identified patent and that said Letters Patent is hereby corrected as shown below:

Column 8, line 23, "1" should read --16--.
Column 8, line 36, "hs" should read --has--.
Column 10, line 20, "sid" should read --said--.

Signed and Sealed this

Twenty-first Day of October, 1986

[SEAL]

Attest:

DONALD J. QUIGG

Attesting Officer

Commissioner of Patents and Trademarks